United States Patent [19]

Grigoriev et al.

[11] 4,339,304

[45] Jul. 13, 1982

[54] METHOD OF TREATING DIAMOND

[76] Inventors: Anatoly P. Grigoriev, ulitsa Ordzhonikidze, 5, kv. 29; Sara K. Lifshits, ulitsa Dzerzhinskogo, 3, kv. 38; Pavel P. Shamaev, ulitsa Pionerskaya, 50/1, kv. 13, all of Yakutsk, U.S.S.R.

[21] Appl. No.: 221,209

[22] Filed: Dec. 30, 1980

[51] Int. Cl.$^3$ .................. B44C 1/22; C03C 15/00; C03C 25/06
[52] U.S. Cl. .................................... 156/635; 156/646; 156/654; 156/DIG. 68
[58] Field of Search ............... 156/635, 646, 654, 628, 156/DIG. 68; 423/446

[56] References Cited

U.S. PATENT DOCUMENTS 1,637,291 7/1927 Barnett ................................ 423/446
3,652,220 3/1972 Lindstrom ........................... 423/446

OTHER PUBLICATIONS

IBM Technical Disclosure Bulletin, vol. 18, No. 12, May 1976, Selective Etching of Sapphire by R. F. Rutz, pp. 4185-4186.

*Primary Examiner*—William A. Powell
*Attorney, Agent, or Firm*—Steinberg &Raskin

[57] ABSTRACT

The method of treating diamond is characterized in that a diamond is treated by contacting it with a template within the temperature, range from 600° to 1800° C., with both diamond and template being at the same temperature and the template being made of a metal or an alloy which dissolves the diamond carbon at the selected contact temperature and the diamond contact with the template is effected in vacuum, an atmosphere of inert gas or in an atmosphere of a gas which does not react with diamond at the contact temperature but reacts at such temperature with the diamond carbon dissolved in the metal or alloy.

3 Claims, No Drawings

METHOD OF TREATING DIAMOND

TECHNICAL FIELD

The present invention relates to methods of treating diamonds to be used in the manufacture of monocrystalline diamond tools and in jewelry.

BACKGROUND OF THE INVENTION

Known in the art are methods for the mechanical treatment of diamond with diamond powder deposited on a rapidly rotating or oscillating metal tool (cutting, grinding, boring), as well as the treatment with laser, or electron or iron beam (cutting and, mainly, boring). Known in the art is a method of making holes in diamond crystals using an oxygen jet at high temperature (cf. P. N. Kiseleva, Technical Diamonds (in Russian), M., Nedra Publishers, 1964, pp. 24–55; Zh. Bonrua, Diamond Cutting (in Russian, in Coll. of Art. "Synthetic Diamonds in Industry"), Kiev, Naukova Dumka Publishers, 1974, pp. 60–65).

There is also known a method of treating diamond by contacting it with a template at 600° C. in an oxygen atmosphere. Diamond is treated by burning-out portions of diamond heated at the contact with a hotter template in oxygen.

A template is made of platinum, ceramic or such substances which withstand heating in oxygen atmosphere to a desired temperature (German Pat. No. 1,013,540).

According to the prior art method, diamond and template should be heated to different temperatures and should move relative to one another, which results in complications in the diamond treatment. During the treatment by the known method, in addition to most heated portions of the diamond which are to be dissolved, the dissolution of the adjacent slightly less heated portions is inevitable, which results in lower accuracy of diamond treatment.

DISCLOSURE OF THE INVENTION

The invention resides in the provision, in a method of treating diamond, of such conditions for contacting diamond and a template which enable improved accuracy and simpler production technique.

This object is accomplished by this invention, in a method of treating diamond comprising contacting diamond at high temperature with a template made of a metal or an alloy, according to the invention. The contact is effected within the temperature range of 600° to 1800° C., both diamond and template being at the same temperature, the template being made of a metal or an alloy dissolving the diamond carbon at the contact temperature, and the contact is carried out in vacuum, an inert gas atmosphere or an atmosphere of a gas which does not react with diamond at the contact temperature but reacts at the same temperature with the diamond carbon dissolved in the metal or alloy.

The template is preferably made of iron, nickel, platinum or alloys thereof.

In order to increase the speed of the diamond treatment, the contact is preferably effected in an atmosphere of a gas which does not react with diamond at the contact temperature but reacts at the same temperature with the diamond carbon dissolved in the metal or alloy.

The above-mentioned gases comprise hydrogen, steam, carbon dioxide, air, oxygen or mixtures thereof.

The method of the present invention substantially simplifies the treatment of diamond and makes it possible to make holes, passages and intricate grooves in diamond and enables the manufacture of intricately shaped products of diamond, such as microcutters. Moreover, the invention also makes it possible to produce a relief image on diamond and enables frosting of the diamond surface. Another advantage of the method resides in that the template does not substantially wear out in the process of diamond treatment, and a single template may be used for the treatment of a large number of diamonds.

BEST MODE FOR CARRYING OUT THE INVENTION

Depending on the final shape of a product, the diamond treatment method may be carried out in various ways.

For instance, to obtain a diamond with a flat surface or with a relief image, the diamond is contacted with a massive template (compared to the diamond size). The contact is effected in an atmosphere of an inert gas or in vacuum. The template is made of a metal or an alloy which is capable of dissolving maximum possible quantity of carbon, such as iron or iron based alloys. The treatment temperature is selected close to the melting point of the eutectic of the metal or alloy with carbon. In case the template is made of iron, the diamond is contacted with a template at 1100° C. since the melting point of the ironcarbon eutectic is 1147° C.

To obtain a frost image or to perform frosting of the diamond surface, a template preferably comprises a thin layer of a metal or an alloy applied to the diamond surface in the form of a paste, or by sputtering. Diamond is preferably contacted with templates at 600° to 1100° C. The process is conducted in an atmosphere of a gas which does not react with diamond at the contact temperature but reacts at the same temperature with the carbon dissolved in the metal or alloy. It is inexpedient to contact diamond with a template at a temperature below 600° C. since there is no adhesion of the template to diamond, which is necessary for the diamond carbon to dissolve, while at a temperature above 1100° C. the diamond surface may be etched too deeply. In such applications a template is preferably made of platinum, nickel, iron and chromium. The most preferred material is platinum since it is not covered with an oxide film in an oxidizing atmosphere and starts dissolving diamond carbon at a lower temperature compared to other metals (e.g. at 600° C.). In case the contact temperature is 600° C. the medium is preferably oxygen or air. At higher temperatures, to avoid direct etching of diamond with gas, oxygen pressure is preferably lowered, or gases which react slower with diamond are used (the gases are selected in the order of decreasing reaction speed with diamond: $O_2$—air—$CO_2$—$H_2O$—$H_2$).

To remove a thick layer of diamond (compared to the diamond size) in making intricate tools, cicrocutters or holes in diamond, diamond is preferably contacted with a template at 1100° to 1800° C. in an atmosphere of a gas which does not react with diamond at the contact temperature but reacts with the diamond carbon dissolved in the template material. The contact below 1100° C. is inexpedient as the treatment process is too long, and above 1800° C. graphitization of diamond begins. At 1100° to 1300° C. it is preferred to use a template of Fe, Co, Ni or their alloys, as well as of alloys of these metals with Mn and Cr. At about 1300° C. a template is made of Pt or platinum based alloys. At 1100° C. to 1800° C. it is preferred to contact in an atmosphere of hydrogen to which a certain amount of water vapour is added to increase the speed of reaction.

In all applications, after the treatment is completed, diamonds are cleaned from the metal or alloy of the template sticking to them or from a thin coating of graphite on the treated surface. Cleaning is effected by allowing the diamonds to stay in a boiling mixture of concentrated hydrochloric and nitric acids in a volumetric ratio of 3:1 and subsequently in boiling concentrated sulphuric acid saturated with $K_2Cr_2O_7$ at room temperature.

Better understanding of the invention may be had from the following specific examples.

EXAMPLE 1

A template for treating diamonds was in the form of an iron plate 2 mm thick with an engraved figure to a depth of about 0.1 mm. A diamond was placed on top of the figure. The diamond was contacted with the template for three hours at 1100° C. in vacuum of $10^{-2}$ Torr. After contacting the diamond with the template, a mirror image of the figure was formed on the diamond facet with the relief height corresponding to the depth of engraving.

EXAMPLE 2

The process was conducted as described in Example 1 with the only difference that the contact was effected in argon medium.

EXAMPLE 3

The (100) facet of a diamond was obtained by mechanical treatment. A figure image was applied to this facet with an alcoholic solution of a mixture of equal parts by weight of calophony and $H_2PtCl_6$. The diamond with the figure applied thereto as described above was heated to 600° C. in the air. Before the temperature reached 600° C., the mixture decomposed to leave a layer of finely dispersed platinum on the diamond surface as a template. After the diamond was contacted with the template in the air atmosphere at 600° C. for five hours a fine frost image of the figure appeared on the diamond.

EXAMPLE 4

A template in the form of a figure made of a layer of finely dispersed platinum was applied to the (111) facet of a diamond by the same method. After the diamond was contacted with the template at 1000° C. for one hour in the atmosphere of a gas composed of 95 vol. percent $CO_2$ and 5 vol. percent $H_2$, an image of the figure, much more clear than in Example 3, appeared on the diamond.

EXAMPLE 5

On a diamond crystal of about 10 mg was placed a template in the form of a wire 0.15 mm in diameter made of an alloy consisting of 86% by weight of Ni and 14% by weight of Fe. Both ends of the wire were secured to a nickel loop which could lower under gravity. The diamond and the loop with the wire were placed into a corundum tube of 10 mm inside diameter. The tube was heated in an electric furnace and a flow of dry hydrogen was passed through the tube at atmospheric pressure at a rate of 0.5 l/h. A groove 0.64 mm deep was cut in the diamond in 13.5 hours of contact at 1250° C. Average cutting speed was 0.05 mm/h.

EXAMPLE 6

On a flattened diamond twin in the form of a triangular plate 0.85 mm thick was placed a template in the form of an equilateral triangle with a side of 1.5 mm and 0.1 mm thick. The template was made of the alloy used in Example 5. The diamond was contacted with the template for 45 hours at 1200° C. in a flow of dry hydrogen. After the contact a triangular through hole with even walls of the same size as the template was formed in the diamond. The treatment speed was 0.02 mm/h.

EXAMPLE 7

On a flattened diamond twin in the form of a triangular plate was placed a template in the form of a hexahedron 0.1 mm thick having a hole in the form corresponding to a gear with 14 teeth of the outside diameter of 2.7 mm. The template was made of the alloy used in Example 5. After the exposure for 29 hours in a flow of dry hydrogen at 1200° C. the template entered the diamond at a depth of 0.4 mm to cut out of the diamond a gear corresponding to the hole in the template in shape and dismensions. The treatment speed was 0.014 mm/h.

EXAMPLE 8

A template of a size of $1\times1\times0.05$ mm in the form of a square nickel plate was placed on a diamond crystal. The diamond was contacted with the template in a flow of hydrogen at dew point $+25°$ C. ($H_2O$ vapour pressure 24 Torr) at 1230° C. for 50 minutes. The template penetrated the diamond crystal at 0.27 mm depth so that the treatment speed was 0.3 mm/h.

EXAMPLE 9

A template of a size $1\times1\times0.05$ mm of an alloy consisting of 90% by weight of nickel and 10% by weight of Cr was placed on a diamond crystal. The diamond was contacted with the template in a flow of hydrogen at dew point $+10°$ C. ($H_2O$ vapour pressure 9 Torr) at 1250° C. for three hours. After the contact a square space 0.9 mm deep was formed in the diamond, that is the treatment speed was 0.3 mm/h.

EXAMPLE 10

A template in the form of a square platinum plate of a size $1\times1\times0.05$ mm was placed on a diamond crystal. The diamond was contacted with the template in a flow of dry hydrogen at 1600° C. for 30 minutes. After the contact, a square space 0.05 mm deep was formed in the diamond, with the treatment speed being 0.1 mm/h.

INDUSTRIAL APPLICABILITY

The method of treating diamonds may be used in the manufacture of monocrystalline diamond tools and in jewelry.

We claim:

1. The method of treating diamond, which comprises contacting a diamond with a template made of a metal or an alloy which at a temperature of about 600° C. to 1800° C. dissolves the diamond carbon, heating said diamond and template in contact therewith at a temperature of about 600° C. to about 1800° C. under vacuum, or in an inert gas atmosphere or in an atmosphere of a gas which at said temperature does not react with diamond but does react with the diamond carbon which becomes dissolved in said metal or alloy, whereby said template in contact with said diamond at said temperature in said atmosphere dissolves diamond carbon in contact therewith, thus changing the appearance of said diamond.

2. Method according to claim 1 wherein said template is made of iron, nickel, platinum or alloys thereof.

3. Method according to claim 1 wherein said atmosphere is comprised of hydrogen, water vapor, carbon dioxide, air, oxygen or mixtures thereof.

* * * * *